(12) United States Patent
Takino et al.

(10) Patent No.: US 10,593,783 B2
(45) Date of Patent: Mar. 17, 2020

(54) PROCESSING METHOD

(71) Applicant: TOKYO ELECTRON LIMITED, Tokyo (JP)

(72) Inventors: Yusuke Takino, Miyagi (JP); Kentarou Fujita, Miyagi (JP); Yusuke Yanagisawa, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/274,273

(22) Filed: Feb. 13, 2019

(65) Prior Publication Data

US 2019/0259860 A1 Aug. 22, 2019

(30) Foreign Application Priority Data

Feb. 19, 2018 (JP) .................. 2018-026998

(51) Int. Cl.
| | |
|---|---|
| *H01L 29/66* | (2006.01) |
| *H01L 21/3213* | (2006.01) |
| *H01L 21/02* | (2006.01) |
| *H01L 29/78* | (2006.01) |
| *H01J 37/32* | (2006.01) |
| *C23C 16/52* | (2006.01) |
| *C23C 16/455* | (2006.01) |
| *H01L 21/311* | (2006.01) |
| *H01L 21/308* | (2006.01) |

(52) U.S. Cl.
CPC .. *H01L 29/66795* (2013.01); *C23C 16/45536* (2013.01); *C23C 16/52* (2013.01); *H01J 37/32458* (2013.01); *H01J 37/32715* (2013.01); *H01J 37/32834* (2013.01); *H01L 21/0228* (2013.01); *H01L 21/02164* (2013.01); *H01L 21/02219* (2013.01); *H01L 21/02274* (2013.01); *H01L 21/308* (2013.01); *H01L 21/31116* (2013.01); *H01L 21/31138* (2013.01); *H01L 21/32137* (2013.01); *H01L 21/32139* (2013.01); *H01L 29/7851* (2013.01); *H01J 2237/3341* (2013.01)

(58) Field of Classification Search
CPC ...................................... C23C 16/52
USPC ........................................... 216/67
See application file for complete search history.

(56) References Cited

U.S. PATENT DOCUMENTS

2018/0269109 A1* 9/2018 Ching ............. H01L 21/823431

FOREIGN PATENT DOCUMENTS

JP 2015-037091 A 2/2015

* cited by examiner

*Primary Examiner* — Roberts P Culbert
(74) *Attorney, Agent, or Firm* — Studebaker & Brackett PC

(57) ABSTRACT

In a processing method according to one exemplary embodiment, a first nitrified region of a workpiece is etched. The first nitrified region is provided on a first protrusion made of silicon. The workpiece further has a second protrusion, a second nitrified region, and an organic region. The second protrusion is made of silicon. The second nitrified region contains silicon and nitrogen and is provided on the second protrusion. The organic region covers the first and second protrusions and the first and second nitrified regions. In the processing method, the organic region is partially etched to expose the first nitrified region. Then, a silicon oxide film is formed to cover the surface of an intermediate product produced from the workpiece. Then, the silicon oxide film is etched to expose an upper surface of the first nitrified region. Then, the first nitrified region is isotropically etched.

7 Claims, 9 Drawing Sheets

PROCESSING METHOD

CROSS-REFERENCE TO RELATED APPLICATIONS

This application is based on and claims the benefit of priority from Japanese Patent Application No. 2018-026998 filed on Feb. 19, 2018, the entire contents of which are incorporated herein by reference.

FIELD

Exemplary embodiments of the present disclosure relate to a processing method of a workpiece.

BACKGROUND

A FinFET is known as one type of field effect transistor (FET). In manufacturing of the FinFET, components serving as a fin and a gate are formed by plasma etching. Japanese Patent Application Laid-Open Publication No. 2015-37091 discloses manufacturing of a FinFET.

SUMMARY

In an aspect, a processing method of a workpiece is provided. The workpiece has a underlying region, a first protrusion, a second protrusion, a first nitrified region, a second nitrified region, an organic region, and a mask. The first protrusion and the second protrusion are formed with silicon and extend to protrude from the underlying region. The first protrusion and the second protrusion are arranged on the underlying region in one direction. The first nitrified region contains silicon and nitrogen and is provided on a top of the first protrusion. The second nitrified region contains silicon and nitrogen and is provided on a top of the second protrusion. The organic region contains carbon and is provided to cover the first protrusion, the second protrusion, the first nitrified region, and the second nitrified region. The mask is provided on the organic region to expose a partial region of the organic region, which extends over the first protrusion and the first nitrified region. According to the aspect, the processing method of the workpiece includes (i) etching the organic region to remove the partial region of the organic region to expose a first nitrified region, (ii) conformally forming a silicon oxide film on a surface of an intermediate product produced from the workpiece by the etching the organic region, (iii) etching the silicon oxide film to expose an upper surface of the first nitrified region, and (iv) etching the first nitrified region isotropically and selectively with respect to the silicon oxide film and the first protrusion.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

DETAILED DESCRIPTION

Figure 1:
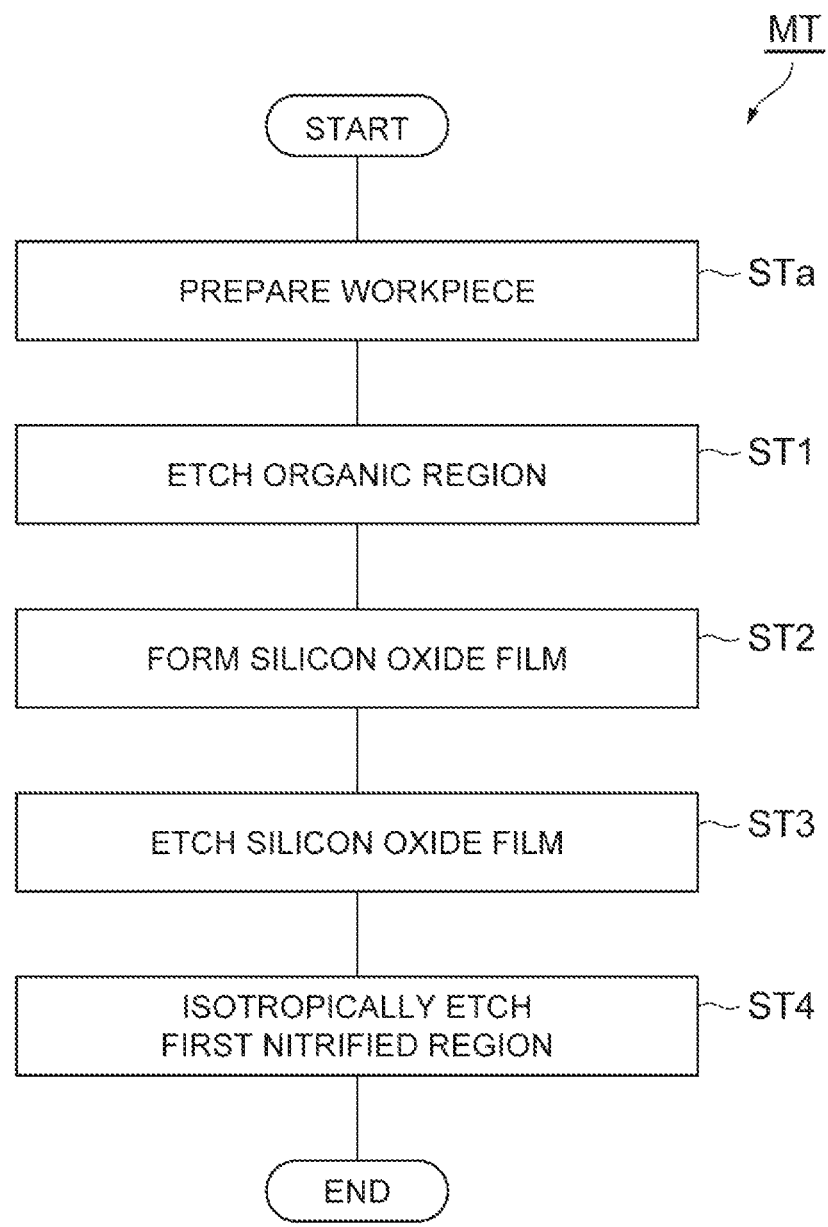
FIG. 1 is a flowchart illustrating a processing method of a workpiece according to an exemplary embodiment.

In the following detailed description, reference is made to the accompanying drawings, which form a part hereof. The exemplary embodiments described in the detailed description, drawing, and claims are not meant to be limiting. Other exemplary embodiments may be utilized, and other changes may be made, without departing from the spirit or scope of the subject matter presented here.

In manufacturing of a FinFET, a mask is formed on a silicon substrate. The mask is patterned to have a plurality of nitrified regions arranged substantially parallel to each other. The plurality of nitrified regions are formed from silicon nitride. Then, a plurality of protrusions, that is, a plurality of fins are formed by etching the substrate. The plurality of protrusions are arranged substantially parallel to each other.

In manufacturing of the FinFET, it is required to selectively remove some of the plurality of protrusions. That is, it is required to selectively remove a first protrusion with respect to a second protrusion. To this end, it is necessary that some of the plurality of nitrified regions are selectively removed. As a method of selectively removing the nitrified region, the following method is conceivable. Firstly, an organic region is provided to cover the plurality of protrusions. The organic region is formed with an organic material containing carbon. Then, a mask is provided on the organic region. The mask exposes the organic region over a nitrified region to be removed (referred to as "a first nitrified region" below), and covers the organic region over a nitrified region to remain (referred to as "a second nitrified region" below).

Then, the organic region is etched to expose the upper surface of the first nitrified region. The exposed first nitrified region is then etched. In the etching of the first nitrified region, it is required to selectively remove silicon nitride with respect to silicon. It is conceivable that a plasma etching with a processing gas containing hydrofluorocarbon is utilized, in the etching of the first nitrified region.

If a boundary position of the mask is shifted to be positioned over the first nitrified region to be removed, by a manufacturing error, a portion of the first nitrified region to be removed is covered by the organic region. Therefore, the portion of the first nitrified region remains by anisotropic plasma etching. As described above, isotropic etching is required for reliably removing the first nitrified region even though the boundary position of the mask is shifted. However, even if the organic region is etched so that a little of the second nitrified region to remain is exposed, the second nitrified region is also etched by isotropic etching. From this background, it is required to retain a nitrified region to remain and to reliably remove a nitrified region to be removed.

In an aspect, a processing method of a workpiece is provided. The workpiece has a underlying region, a first protrusion, a second protrusion, a first nitrified region, a second nitrified region, an organic region, and a mask. The first protrusion and the second protrusion are formed with silicon and extend to protrude from the underlying region. The first protrusion and the second protrusion are arranged on the underlying region in one direction. The first nitrified region contains silicon and nitrogen and is provided on a top of the first protrusion. The second nitrified region contains silicon and nitrogen and is provided on a top of the second protrusion. The organic region contains carbon and is provided to cover the first protrusion, the second protrusion, the first nitrified region, and the second nitrified region. The mask is provided on the organic region to expose a partial region of the organic region, which extends over the first protrusion and the first nitrified region. According to the aspect, the processing method of the workpiece includes (i) etching the organic region to remove the partial region of the organic region to expose a first nitrified region, (ii) conformally forming a silicon oxide film on a surface of an intermediate product produced from the workpiece by the etching the organic region, (iii) etching the silicon oxide film to expose an upper surface of the first nitrified region, and (iv) etching the first nitrified region isotropically and selectively with respect to the silicon oxide film and the first protrusion.

In the processing method according to the aspect, isotropic etching is used as etching of the exposed first nitrified region. According to isotropic etching, even though the boundary position of the mask is shifted from a designed position by a manufacturing error, the first nitrified region is reliably removed so long as at least a portion of the first nitrified region is exposed. Thus, the large manufacturing error of the mask is allowable. In addition, the first nitrified region is exposed by etching the organic region (that is, etch back of the organic region), forming the silicon oxide film, and etching the silicon oxide film (that is, etch back of the silicon oxide film). However, the organic region, the second protrusion, and the second nitrified region are protected by the silicon oxide film. The isotropic etching of the first nitrified region uses a chemical reaction without substantially using physical energy, and is therefore able to suppress etching of the silicon oxide film. Hence, portions to remain, such as the organic region, the second protrusion, and the second nitrified region, are protected by the silicon oxide film, and thus are retained.

In one embodiment, the silicon oxide film is conformally formed. In one embodiment, the silicon oxide film is formed by an atomic layer deposition method.

In one embodiment, a sequence is performed in the etching the first nitrified region once or more. The sequence includes (a) modifying at least a portion of the first nitrified region, which includes the surface of the first nitrified region, by a plasma of a hydrogen-containing gas to form a modified region from at least the portion of the first nitrified region; and (b) etching the modified region by a plasma of a fluorine-containing gas.

In one embodiment, the sequence is performed plural times. The sequence performed at least in a period including a time point at which the first protrusion is exposed includes oxidizing a portion of the first protrusion, which includes the surface of the first protrusion, by a plasma of an oxygen-containing gas. According to the embodiment, it is possible to suppress etching of the first protrusion by isotropic etching. In one embodiment, a period in which the modifying at least a portion of the first nitrified region is performed and a period in which the oxidizing a portion of the first protrusion is performed may be identical to each other or may partially overlap each other. That is, a plasma of a gas mixture of the hydrogen-containing gas and the oxygen-containing gas may be simultaneously generated in the same space. In another embodiment, the period in which the modifying at least a portion of the first nitrified region is performed and a period in which the oxidizing a portion of the first protrusion is performed may be different from each other. In this embodiment, the plasma of the gas mixture of the hydrogen-containing gas and the oxygen-containing gas is not generated simultaneously in the same space.

In one embodiment, in the etching the organic region, the organic region may be etched such that a position of an upper surface of the organic region in a height direction around the first protrusion is identical to or lower than a position of a boundary between the first nitrified region and the first protrusion in the height direction. According to the embodiment, even though the first nitrified region is completely removed, a state where the organic region is covered by the silicon oxide film is maintained.

In one embodiment, the etching the organic region, the forming a silicon oxide film, the etching the silicon oxide film, and the etching the first nitrified region are performed in a state where the workpiece is accommodated in a single chamber of a single plasma processing apparatus.

Hereinafter, various embodiments will be described in detail with reference to the drawings. In the drawing, the same or equivalent portions are denoted by the same reference symbols.

FIG. 1 is a flowchart illustrating a processing method of a workpiece according to an exemplary embodiment. The processing method (referred to as "a method MT" below) illustrated in FIG. 1 is used for selectively etching at least one of a plurality of nitrified regions in a workpiece.

Figure 2A:
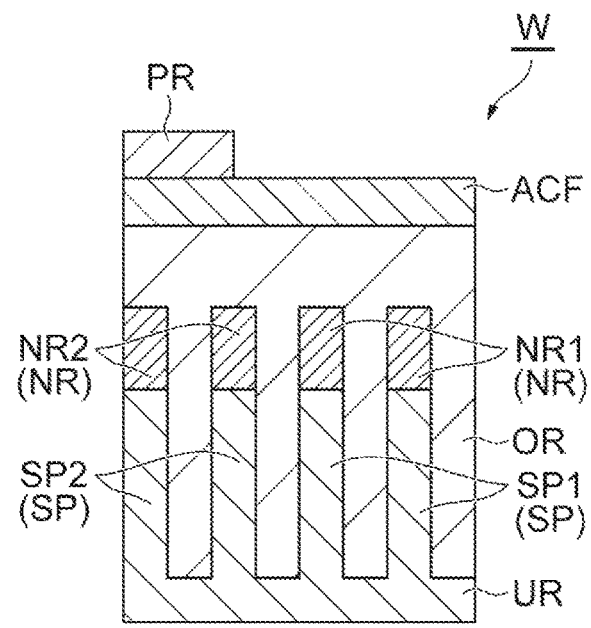
FIG. 2A is a partially enlarged sectional view illustrating an example of a workpiece produced in a preparation stage of the method illustrated in FIG. 1.
Figure 2B:
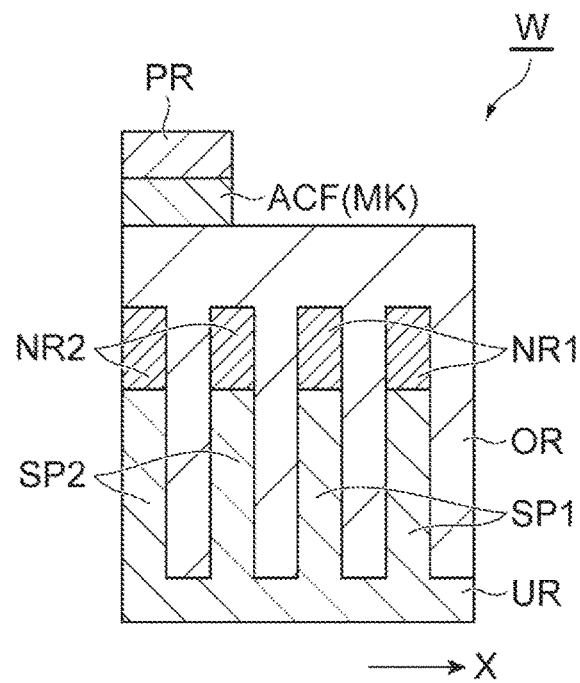
FIG. 2B is a partially enlarged sectional view illustrating an example of a workpiece to which Step ST1 in the method illustrated in FIG. 1 is applied.

FIG. 2B is a partially enlarged sectional view illustrating an example of a workpiece to which the method illustrated in FIG. 1 is applied. A workpiece W has a disc shape, for example. As illustrated in FIG. 2B, the workpiece W has an underlying region UR, a plurality of protrusions SP, a plurality of nitrified regions NR, an organic region OR, and a mask MK. The workpiece W is an intermediate product manufactured in manufacturing of a FinFET. The underlying region UR is formed with silicon. The plurality of protrusions SP extend to protrude from the underlying region UR. The plurality of protrusions SP are formed with silicon. The plurality of protrusions SP configure fins in the FinFET. The plurality of protrusions SP include one or more first protrusions SP1 and one or more second protrusions SP2. The one or more first protrusions SP1 and the one or more second protrusions SP2 are arranged in parallel to each other in one direction (referred to as "an X-direction" below). The underlying region UR and the plurality of protrusions SP may be formed from a single silicon substrate.

The plurality of nitrified regions NR are provided on the tops of the plurality of protrusions SP, respectively. The plurality of nitrified regions NR contain silicon and nitrogen. The plurality of nitrified regions NR are formed with silicon nitride, for example. The plurality of nitrified regions NR include one or more first nitrified regions NR1 and one or more second nitrified regions NR2. The one or more first nitrified regions NR1 are provided on the tops of the one or more first protrusions SP1, respectively. The one or more second nitrified regions NR2 are provided on the tops of the one or more second protrusions SP2, respectively. In an example illustrated in FIG. 2B, the plurality of protrusions SP include a plurality of first protrusions SP1 and a plurality of second protrusions SP2, and the plurality of nitrified regions NR include a plurality of first nitrified regions NR1 and a plurality of second nitrified regions NR2. However, the number of portions or regions is not limited thereto.

The organic region OR is provided to cover the plurality of first protrusions SP1, the plurality of second protrusions SP2, the plurality of first nitrified regions NR1, and the plurality of second nitrified regions NR2. The organic region OR is provided between the first protrusions SP1 adjacent to each other, between the second protrusions SP2 adjacent to each other, and between the first protrusion SP1 and the second protrusion SP2 adjacent to each other. The organic region OR is formed with an organic material and contains carbon. The organic region OR is a carbon hard mask, for example.

The mask MK is provided on the organic region OR. The mask MK is provided to expose a partial region of the organic region OR, which extends over the plurality of first protrusions SP1 and the plurality of first nitrified regions NR1. The boundary position of the mask MK in the X-direction coincides with the central position between a pair of side surfaces of the second nitrified region NR2 adjacent to the first nitrified region NR1, on a design. The boundary position of the mask MK in the X-direction may be shifted from a designed value so long as the organic region OR provided between the first protrusion SP1 and the second protrusion SP2 adjacent to each other, and the plurality of second nitrified regions NR2 are covered by the silicon oxide film after the upper surfaces of the plurality of first nitrified regions NR1 are exposed by etching the silicon oxide film in step ST3 which will be described later.

Figure 3:
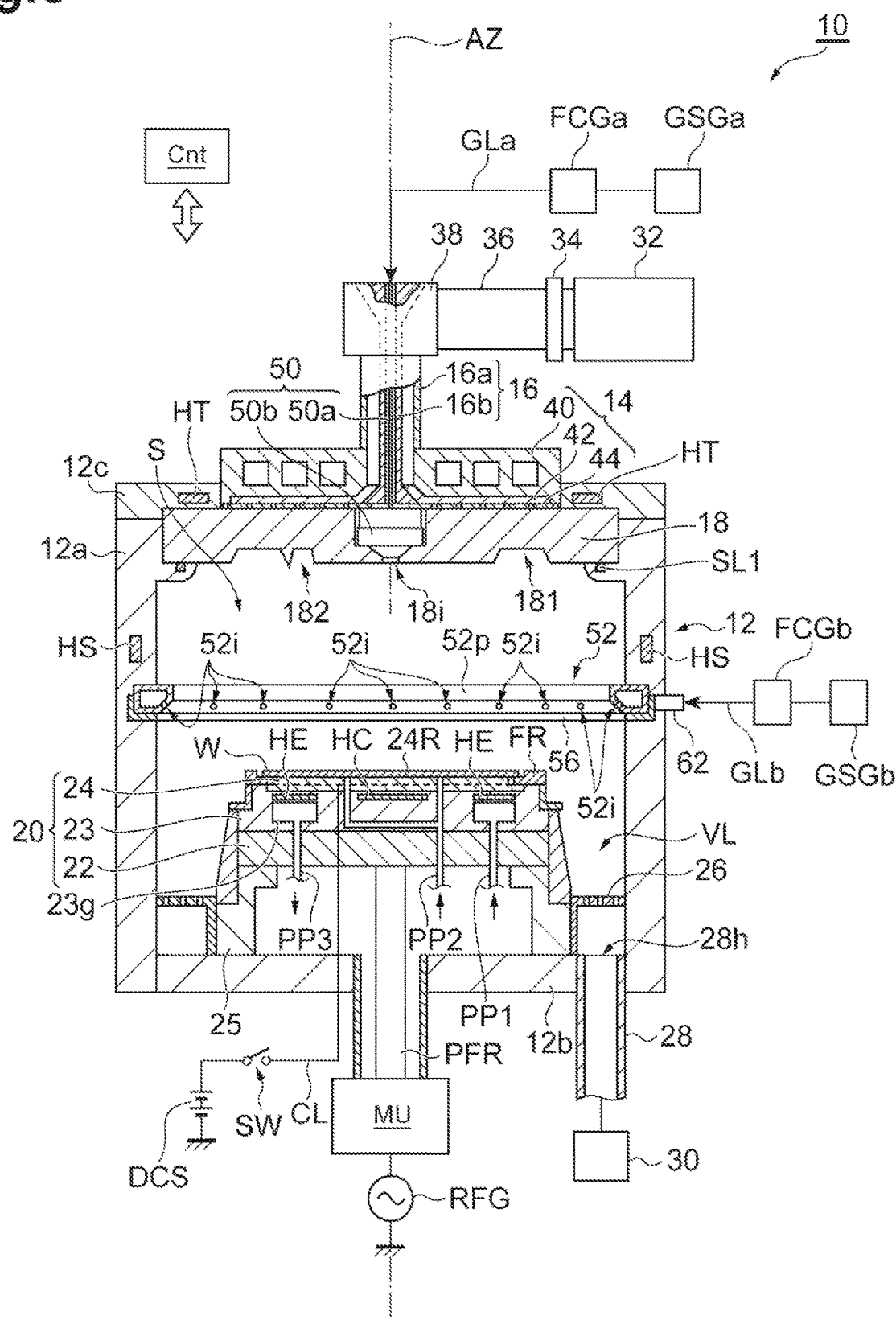
FIG. 3 schematically illustrates an example of a plasma processing apparatus which may be used in performing the method illustrated in FIG. 1.

The method MT may be performed with a single plasma processing apparatus in one embodiment. FIG. 3 schematically illustrates an example of a plasma processing apparatus which may be used in performing the method illustrated in FIG. 1 is performed. FIG. 3 schematically illustrates a structure of the plasma processing apparatus in a longitudinal section.

A plasma processing apparatus 10 illustrated in FIG. 3 includes a chamber 12. The chamber 12 provides an internal space S. Processing is performed on a workpiece W in the internal space S. The chamber 12 may include a side wall 12a, a bottom 12b, and a ceiling 12c.

The side wall 12a has a substantially cylindrical shape. The central axis of the side wall 12a substantially coincides with an axis AZ extending in a Z-direction (vertical direction). The inner diameter of the side wall 12a is 540 mm, for example. The bottom 12b extends to close the lower end of the side wall 12a. The upper end of the side wall 12a opens. An opening at the upper end of the side wall 12a is closed by the dielectric window 18. The dielectric window 18 is interposed between the upper end of the side wall 12a and the ceiling 12c. A sealing member SL1 may be interposed between the dielectric window 18 and the upper end of the side wall 12a. The sealing member SL1 is an O-ring, for example. The sealing member SL1 contributes to airtightness of the chamber 12.

The plasma processing apparatus 10 further includes a support stand 20. The support stand 20 is provided under the dielectric window 18 in the internal space S. The support stand 20 includes a plate 22, a base 23, and an electrostatic chuck 24.

The plate 22 is a member made of metal, for example, is formed with aluminum. The plate 22 has a substantially disc shape. The plate 22 is supported by a tubular support portion 25. The support portion 25 extends upward from the bottom 12b in the internal space S. The base 23 is provided on the plate 22. The base 23 is a member made of metal, for example, is formed with aluminum. The base 23 has a substantially disc shape. The base 23 is electrically connected to the plate 22.

The electrostatic chuck 24 is provided on the base 23. The upper surface of the electrostatic chuck 24 includes a placement region 24R. The placement region 24R is a region on which a workpiece W is placed. The placement region 24R may have a planar shape which is substantially circular, similar to the workpiece W. The center of the placement region 24R is positioned on the axis AZ.

The workpiece W is placed on the electrostatic chuck 24 and is held by the electrostatic chuck 24. The electrostatic chuck 24 includes a body and an electrode film. The body of the electrostatic chuck 24 is formed with a dielectric material and has a substantially disc shape. The electrode film of the electrostatic chuck 24 is provided in the body. A DC power source DCS is electrically connected to the electrode film of the electrostatic chuck 24 via a switch SW and a coated line CL. If a DC voltage from the DC power source DCS is applied to the electrode film of the electrostatic chuck 24, an electrostatic attractive force is generated between the workpiece W and the electrostatic chuck 24. The workpiece W is attracted to the electrostatic chuck 24 by the generated electrostatic attractive force, and thus is held by the electrostatic chuck 24. A focus ring FR is disposed on an outside of the electrostatic chuck 24 in a radial direction to annularly surround the edge of the workpiece W.

The base 23 configures a high-frequency electrode. The base 23 is electrically connected to a high-frequency power generator RFG via the plate 22, a power feeding rod PFR, and a matching unit MU. The high-frequency power generator RFG generates high-frequency power to be supplied to the base 23. The high-frequency power generated by the high-frequency power generator RFG has a frequency suitable for controlling energy of ions drawn from plasma to the workpiece W. The frequency is a frequency which is equal to or smaller than 13.56 MHz, for example. The matching unit MU accommodates a matcher for matching between impedance on the high-frequency power generator RFG side and impedance on a load side, such as the electrode, the plasma, and the chamber 12. The matcher includes a blocking capacitor for generating a self-bias.

A coolant chamber 23g is provided in the base 23. The coolant chamber 23g extends in the base 23 so as to have a spiral shape, for example. A coolant (for example, cooling water) is supplied to the coolant chamber 23g from a chiller unit through a pipe PP1. The coolant which has been supplied to the coolant chamber 23g is brought back to the chiller unit through a pipe PP3. The temperature of the workpiece W placed on the electrostatic chuck 24 is adjusted by heat exchange between the coolant and the base 23. In the plasma processing apparatus 10, a heat transfer gas, for example, a He gas, from a heat-transfer gas supply unit is supplied between the upper surface of the electrostatic chuck 24 and the workpiece W through a pipe PP2. Heat exchange between the workpiece W and the electrostatic chuck 24 is accelerated by the heat transfer gas.

The plasma processing apparatus 10 may further include heaters HT, HS, HC, and HE as a temperature control mechanism. The heater HT is provided in the ceiling 12c and annularly extends to surround an antenna 14. The heater HS is provided in the side wall 12a and extends in a circumferential direction around the axis AZ. The heater HC and the heater HE are provided in the support stand 20. The heater HC and the heater HE are provided in the base 23 or the electrostatic chuck 24. The heater HC is provided under the center portion of the above-described placement region 24R, that is, in a region intersecting the axis AZ. The heater HE extends in the circumferential direction to surround the heater HC. The heater HE is provided under an outer edge portion of the above-described placement region 24R.

An annular exhaust path VL is provided around the support stand 20. A baffle plate 26 is provided in the exhaust path VL. The baffle plate 26 extends around the support stand 20 in the circumferential direction. A plurality of through-holes are formed in the baffle plate 26. The exhaust path VL is connected to an exhaust pipe 28 that provides an exhaust port 28h. The exhaust pipe 28 is attached to the bottom 12b of the chamber 12. A exhaust device 30 is connected to the exhaust pipe 28. The exhaust device 30 includes a pressure regulator and a vacuum pump such as a turbo molecular pump. With the exhaust device 30, the pressure in the internal space S can be reduced to a desired degree of vacuum. A gas can be exhausted from the outer circumference of the support stand 20 through the exhaust line VL by operating the exhaust device 30.

The plasma processing apparatus 10 further includes the antenna 14, a coaxial waveguide 16, the dielectric window 18, a microwave generator 32, a tuner 34, a waveguide 36, and a mode converter 38. The microwave generator 32 generates a microwave having a frequency of 2.45 GHz, for example. The microwave generator 32 is connected to the upper portion of the coaxial waveguide 16 through the tuner 34, the waveguide 36, and the mode converter 38. The central axis of the coaxial waveguide 16 substantially coincides with the axis AZ.

The coaxial waveguide 16 includes an outer conductor 16a and an inner conductor 16b. The outer conductor 16a has a cylindrical shape. The lower end of the outer conductor 16a is electrically connected to the surface of the upper portion of a cooling jacket 40. The cooling jacket 40 has a conductive surface. The inner conductor 16b has a substantially cylindrical shape. The inner conductor 16b is provided on an inner side of the outer conductor 16a so as to be coaxial with the outer conductor 16a. The lower end of the inner conductor 16b is connected to a slot plate 44 of the antenna 14.

In one embodiment, the antenna 14 is a radial line slot antenna. The antenna 14 is disposed in an opening formed in the ceiling 12c, and is provided on the upper surface of the dielectric window 18. The antenna 14 includes a dielectric plate 42 and a slot plate 44. The dielectric plate 42 shortens the wavelength of the microwave, and has a substantially disc shape. The dielectric plate 42 is formed with, for example, quartz or alumina. The dielectric plate 42 is interposed between the slot plate 44 and the lower surface of the cooling jacket 40. Thus, the antenna 14 is constituted by the dielectric plate 42, the slot plate 44, and the lower surface of the cooling jacket 40.

Figure 4:
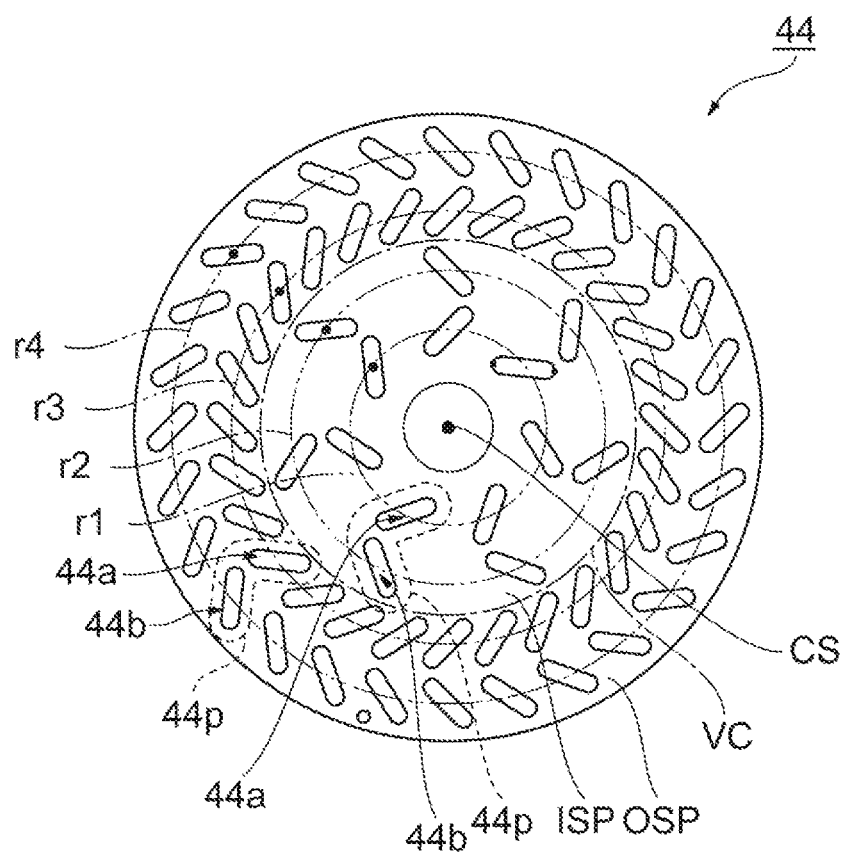
FIG. 4 is a plan view illustrating an example of a slot plate.

FIG. 4 is a plan view illustrating an example of a slot plate. The slot plate 44 has a thin plate shape and has a disc shape. Both surfaces of the slot plate 44 in a plate thickness direction are flat. The center CS of the circular slot plate 44 is positioned on the axis AZ. A plurality of slot pairs 44p are provided in the slot plate 44. Each of the plurality of slot pairs 44p includes two slot holes 44a and 44b penetrating the slot plate 44 in the plate thickness direction. The planar shape of each of the slot holes 44a and 44b is a long hole shape. In each of the slot pair 44p, a direction in which a major axis of the slot hole 44a extends and a direction in which a major axis of the slot hole 44b extends intersect with each other or are orthogonal to each other.

In the example illustrated in FIG. 4, the plurality of slot pairs 44p are roughly classified into an inner slot pair group ISP and an outer slot pair group OSP. The inner slot pair group ISP is provided on an inside of a virtual circle VC extending around the axis AZ. The outer slot pair group OSP is provided on an outside of the virtual circle VC. The inner slot pair group ISP includes a plurality of slot pairs 44p. In the example illustrated in FIG. 4, the inner slot pair group ISP includes 7 slot pairs 44p. The plurality of slot pairs 44p of the inner slot pair group ISP are arranged at an equal distance in the circumferential direction with respect to the center CS. A plurality of slot holes 44a included in the inner slot pair group ISP are arranged at an equal distance such that the centroid of each of the slot holes 44a is positioned on a circle having a radius r1 from the center CS of the slot plate 44. A plurality of slot holes 44b included in the inner slot pair group ISP are arranged at an equal distance such that the centroid of each of the slot holes 44b is positioned on a circle having a radius r2 from the center CS of the slot plate 44. The radius r2 is greater than the radius r1.

The outer slot pair group OSP includes a plurality of slot pairs 44p. In the example illustrated in FIG. 4, the outer slot pair group OSP includes 28 slot pairs 44p. A plurality of slot pairs 44p in the outer slot pair group OSP are arranged at an equal distance in the circumferential direction with respect to the center CS. The plurality of slot holes 44a included in the outer slot pair group OSP are arranged at an equal distance such that the centroid of each of the slot holes 44a is positioned on a circle having a radius r3 from the center CS of the slot plate 44. The plurality of slot holes 44b included in the outer slot pair group OSP are arranged at an equal distance such that the centroid of each of the slot holes 44b is positioned on a circle having a radius r4 from the center CS of the slot plate 44. The radius r3 is greater than the radius r2. The radius r4 is greater than the radius r3.

Each of the slot holes 44a of the inner slot pair group ISP and the outer slot pair group OSP is formed such that the major axis thereof has an equal angle to a line segment joining the center CS and the centroid thereof. Each of the slot holes 44b of the inner slot pair group ISP and the outer slot pair group OSP is formed such that the major axis thereof has an equal angle to the line segment joining the center CS and the centroid thereof.

Figure 5:
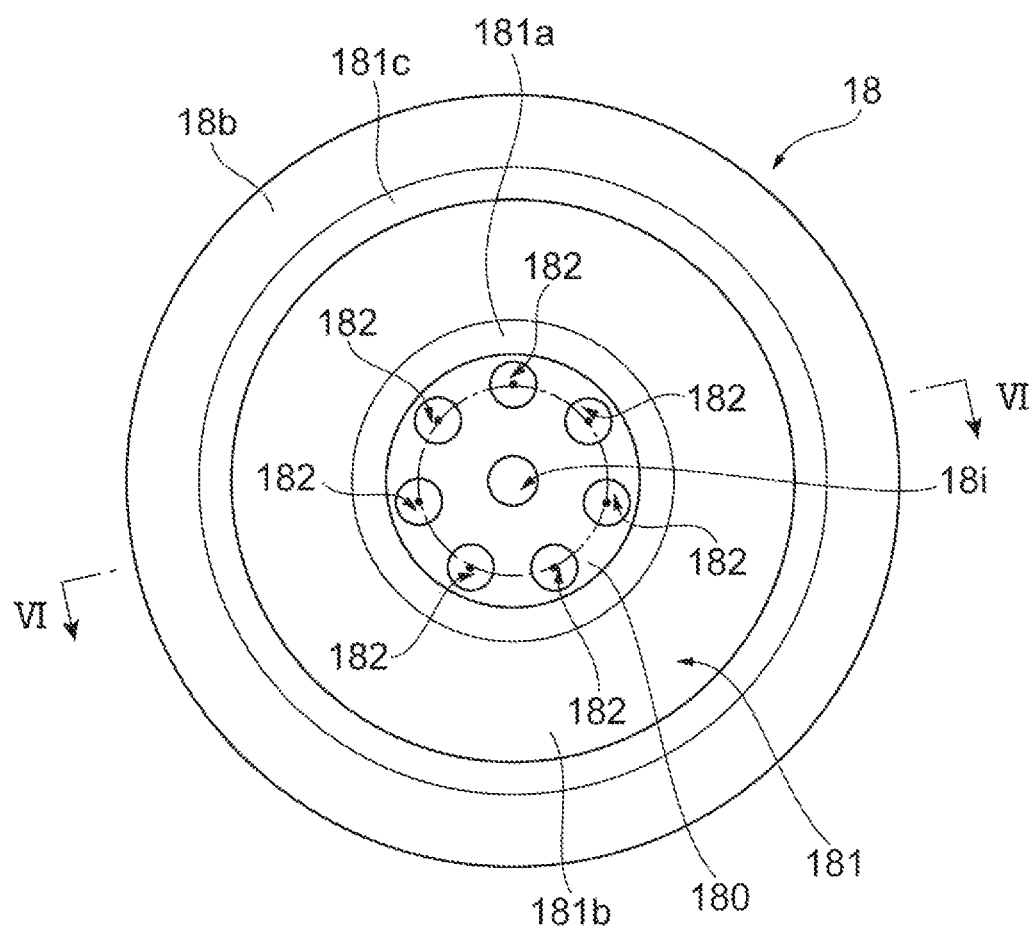
FIG. 5 is a plan view illustrating an example of a dielectric window.
Figure 6:
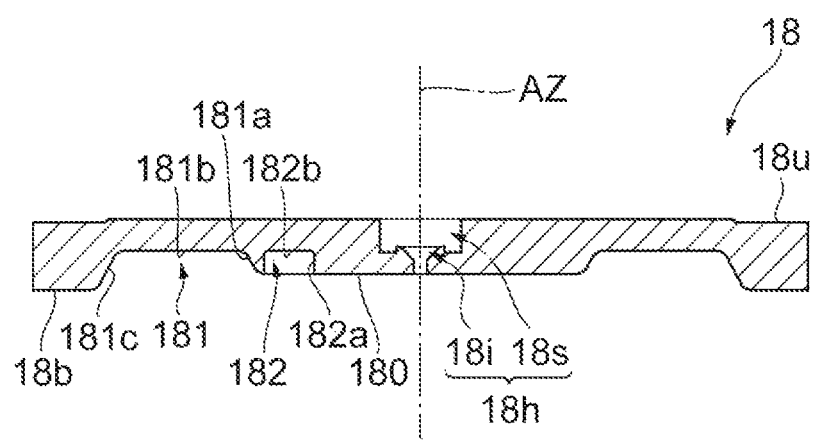
FIG. 6 is a sectional view taken along line VI-VI in FIG. 5.

FIG. 5 is a plan view illustrating an example of a dielectric window. FIG. 5 illustrates a state when the dielectric window is viewed from the internal space S side. FIG. 6 is a sectional view taken along line VI-VI in FIG. 5. The dielectric window 18 is formed with a dielectric material such as quartz or alumina, and has a substantially disc shape. The slot plate 44 is provided on the upper surface 18u of the dielectric window 18.

The through-hole 18h is formed in the center of the dielectric window 18. An upper-side portion of the through-hole 18h is a space 18s in which an injector 50b of a central introduction portion 50 which will be described later is accommodated. A lower-side portion of the through-hole 18h corresponds to a central introduction port 18i of the central introduction portion 50 which will be described later. The central axis of the dielectric window 18 substantially coincides with the axis AZ.

A surface of the dielectric window on an opposite side of the upper surface 18u, that is, the lower surface 18b is in contact with the internal space S. The lower surface 18b has various shapes. Specifically, the lower surface 18b has a flat surface 180. The flat surface 180 is provided in the central region which surrounds the central introduction port 18i. The flat surface 180 is a flat surface orthogonal to the axis AZ. The lower surface 18b defines a first recess 181. The first recess 181 extends annularly in an outer region of the flat surface 180 in the radial direction, and is recessed to an inward side of the dielectric window 18 in the plate thickness direction so as to have a tapered shape.

The first recess 181 is defined by an inner tapered surface 181a, a bottom surface 181b, and an outer tapered surface 181c. The bottom surface 181b is provided closer to the upper surface 18u than the flat surface 180 is and annularly extends in parallel to the flat surface 180. The inner tapered surface 181a extends annularly between the flat surface 180 and the bottom surface 181b and is inclined from the flat surface 180. The outer tapered surface 181c extends annularly between the bottom surface 181b and a peripheral portion of the lower surface 18b, and is inclined from the bottom surface 181b. A peripheral region of the lower surface 18b serves as a surface in contact with the side wall 12a.

The lower surface 18b further defines a plurality of second recesses 182. The plurality of second recesses 182 are recessed from the flat surface 180 to an inward side in the plate thickness direction. The number of the plurality of second recesses 182 is 7 in the example illustrated in FIGS. 5 and 6. The plurality of second recesses 182 are formed at an equal distance in the circumferential direction. The plurality of second recesses 182 have a planar shape which is circular in a plane orthogonal to the axis AZ. Specifically, an inside surface 182a that defines the second recess 182 is a cylindrical surface extending in the Z-direction. The bottom surface 182b that defines the second recess 182 is provided closer to the upper surface 18u than the flat surface 180 is, and is a circular surface parallel to the flat surface 180.

Figure 7:
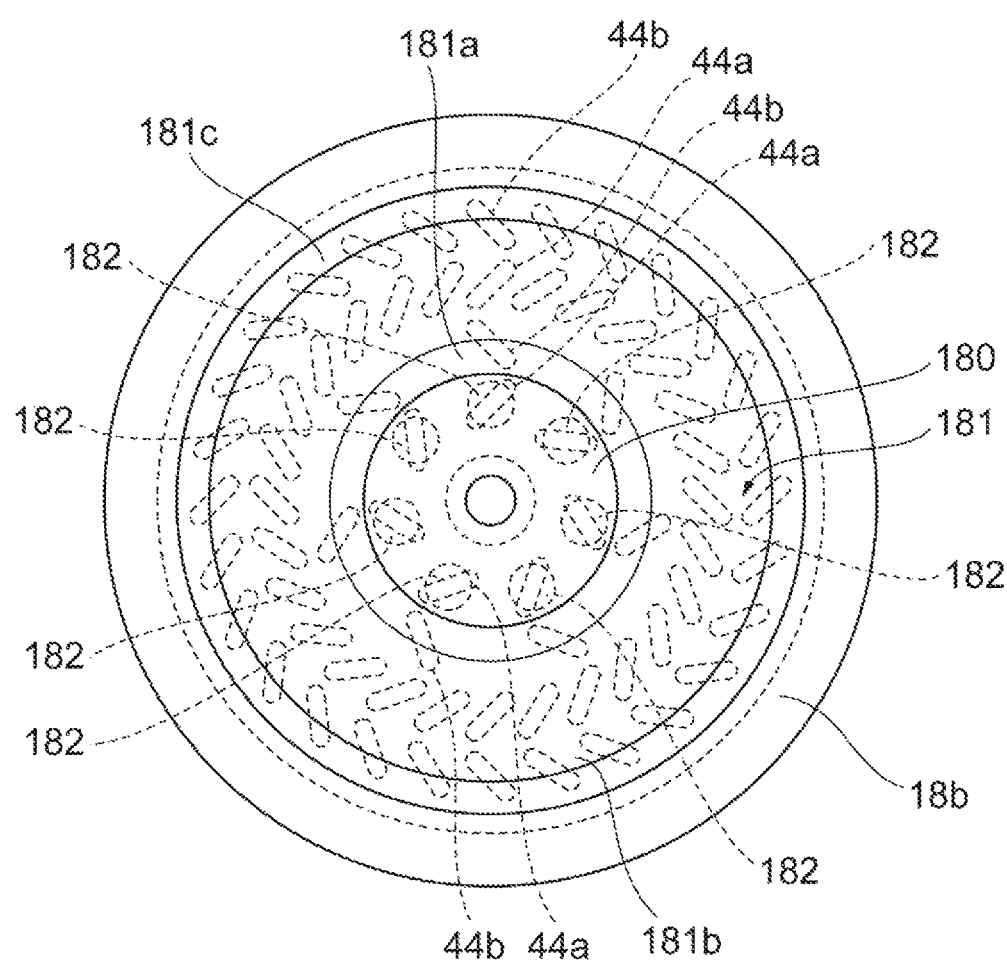
FIG. 7 is a plan view illustrating a state where the slot plate illustrated in FIG. 4 is provided on the dielectric window illustrated in FIG. 5.

FIG. 7 is a plan view illustrating a state where the slot plate illustrated in FIG. 4 is provided on the dielectric window illustrated in FIG. 5. FIG. 7 illustrates a state where the dielectric window 18 is viewed from a lower side. As illustrated in FIG. 7, in planar view, that is, when viewed in the Z-direction, the plurality of slot holes 44a and the plurality of slot holes 44b in the outer slot pair group OSP and the plurality of slot holes 44b in the inner slot pair group ISP overlap the first recess 181. Specifically, in planar view, the plurality of slot holes 44b in the outer slot pair group OSP partially overlap the outer tapered surface 181c, and partially overlap the bottom surface 181b. In planar view, the plurality of slot holes 44a in the outer slot pair group OSP overlap the bottom surface 181b. In planar view, the plurality of slot holes 44b in the inner slot pair group ISP partially overlap the inner tapered surface 181a, and partially overlap the bottom surface 181b.

In planar view, that is, when viewed in the Z-direction, the plurality of slot holes 44a in the inner slot pair group ISP overlap the second recess 182. Specifically, in planar view, the plurality of slot holes 44a are configured such that the centroids (centers) of the bottom surfaces of the plurality of second recesses 182 are positioned in the plurality of slot holes 44a in the inner slot pair group ISP, respectively.

Descriptions will be made by referring to FIG. 3 again. In the plasma processing apparatus 10, a microwave generated by the microwave generator 32 propagates to the dielectric plate 42 via the coaxial waveguide 16, and then is applied to the dielectric window 18 from the slot holes 44a and 44b of the slot plate 44.

In the dielectric window 18, an electric field of the microwave concentrates on the first recess 181 and the second recess 182, and energy of the microwave concentrates on the first recess 181 and the second recess 182. Thus, plasma is stably generated in the first recess 181 and the second recesses 182. Therefore, plasma distributed in the radial direction and the circumferential direction is generated right under the dielectric window 18.

The plasma processing apparatus 10 includes the central introduction portion 50 and a peripheral introduction portion 52. The central introduction portion 50 includes a tube 50a, the injector 50b, and the central introduction port 18i. The tube 50a penetrates an inner hole of the inner conductor 16b of the coaxial waveguide 16. The end portion of the tube 50a is positioned in the space 18s (see FIG. 6) of the dielectric window 18. The space 18s is formed in a region intersecting the axis AZ in the dielectric window 18. The injector 50b is accommodated under the end portion of the tube 50a in the space 18s. A plurality of through-holes extending in the Z-direction is provided in the injector 50b. The central introduction port 18i is formed in the dielectric window 18. The central introduction port 18i is continuous under the space 18s and extends along the axis AZ. In the central introduction portion 50, a gas is supplied to the injector 50b through the tube 50a, and a gas is injected from the injector 50b through the central introduction port 18i. Thus, the central introduction portion 50 injects a gas right under the dielectric window 18 along the axis AZ. That is, the central introduction portion 50 introduces a gas into a plasma generation region in which an electron temperature is high.

The peripheral introduction portion 52 includes a plurality of peripheral introduction ports 52i. In the plurality of peripheral introduction ports 52i, mainly, a gas is supplied to an edge region of the workpiece W. The plurality of peripheral introduction ports 52i opens toward the edge region of the workpiece W or the edge portion of the placement region 24R. The plurality of peripheral introduction ports 52i is arranged in the circumferential direction, below the central introduction port 18i and above the support stand 20. That is, the plurality of peripheral introduction ports 52i is arranged in the circumferential direction around the axis AZ, in a region (plasma diffusion region) in which the electron temperature is lower than that in a region just under the dielectric window 18. In the peripheral introduction portion 52, a gas is supplied toward the workpiece W from the region in which the electron temperature is low. Thus, the dissociation degree of a gas introduced from the peripheral introduction portion 52 into the internal space S is suppressed to be lower than the dissociation degree of a gas supplied from the central introduction portion 50 into the internal space S.

The peripheral introduction portion 52 may further include an annular pipe 52p. The plurality of peripheral introduction ports 52i is formed in the pipe 52p. The annular pipe 52p is formed with quartz, for example. As illustrated in FIG. 3, the annular pipe 52p may be provided along an inner wall surface of the side wall 12a. In other words, the annular pipe 52p is not disposed on a path joining the lower surface of the dielectric window 18 to the placement region 24R, that is, the workpiece W. Thus, the annular pipe 52p does not hinder diffusion of plasma. Since the annular pipe 52p is provided on the inner wall surface of the side wall 12a, the consumption by plasma of the annular pipe 52p is suppressed, and thus it is possible to reduce a replacement frequency of the annular pipe 52p. Further, since the annular pipe 52p is provided along the side wall 12a so as to allow temperature control by the heater, the temperature of a gas to be introduced from the peripheral introduction portion 52 into the internal space S becomes stable.

The plurality of peripheral introduction ports 52i may open toward the edge region of the workpiece W. That is, the plurality of peripheral introduction ports 52i is inclined from a plane orthogonal to the axis AZ such that a gas is injected toward the edge region of the workpiece W. As described above, the peripheral introduction port 52i opens to be inclined toward the edge region of the workpiece W. Thus, active species of the gas injected from the peripheral introduction port 52i are directly directed to the edge region of the workpiece W. Thus, it is possible to supply active species of a gas without being deactivated at the edge of the workpiece W. As a result, it is possible to reduce variations of a processing rate in each region in the radial direction of the workpiece W.

A first gas source group GSGa is connected to the central introduction portion 50 through a first flow-rate control unit group FCGa. The first gas source group GSGa includes a plurality of first gas sources. The plurality of first gas sources are sources of plural types of gases to be used in the method MT. The first flow-rate control unit group FCGa includes a plurality of first flow-rate control units. Each of the plurality of first flow-rate control units includes two valves and a flow rate controller provided between the two valves, for example. The flow rate controller is, for example, a mass flow controller or a pressure control type flow controller. The plurality of first gas sources are connected to a common gas line GLa through the plurality of first flow-rate control units, respectively. The common gas line GLa is connected to the central introduction portion 50.

A second gas source group GSGb is connected to the peripheral introduction portion 52 through a second flow-rate control unit group FCGb. The second gas source group GSGb includes a plurality of second gas sources. The plurality of second gas sources are sources of plural types of gases to be used in the method MT. The second flow-rate control unit group FCGb includes a plurality of second flow-rate control units. Each of the plurality of second flow-rate control units includes two valves and a flow rate controller provided between the two valves, for example. The flow rate controller is, for example, a mass flow controller or a pressure control type flow controller. The plurality of second gas sources is connected to a common gas line GLb through the plurality of second flow-rate control units, respectively. The common gas line GLb is connected to the peripheral introduction portion 52.

In one embodiment, the plasma processing apparatus 10 may further include a control unit Cnt, as illustrated in FIG. 3. The control unit Cnt may be a programmable computer device. The control unit Cnt may include a processor, a storage device such as a memory, an input device such as a keyboard and a mouse, a display device, and an input and output interface of a signal. A control program and recipe data are stored in the storage device in the control unit Cnt. The processor in the control unit Cnt executes the control program to control the components of the plasma processing apparatus 10 in accordance with the recipe data. With such an operation of the control unit, the method MT may be performed.

Figure 2C:
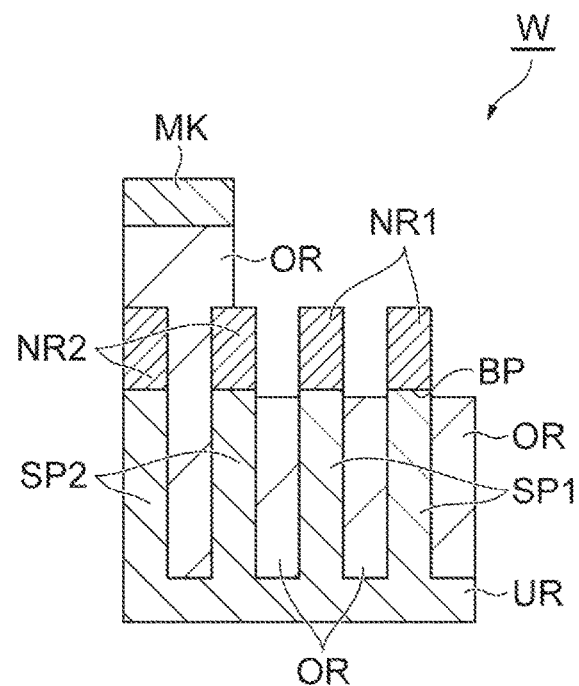
FIG. 2C is a partially enlarged sectional view illustrating an example of a workpiece in a state after Step ST1 in the method illustrated in FIG. 1 has been performed.
Figure 2D:
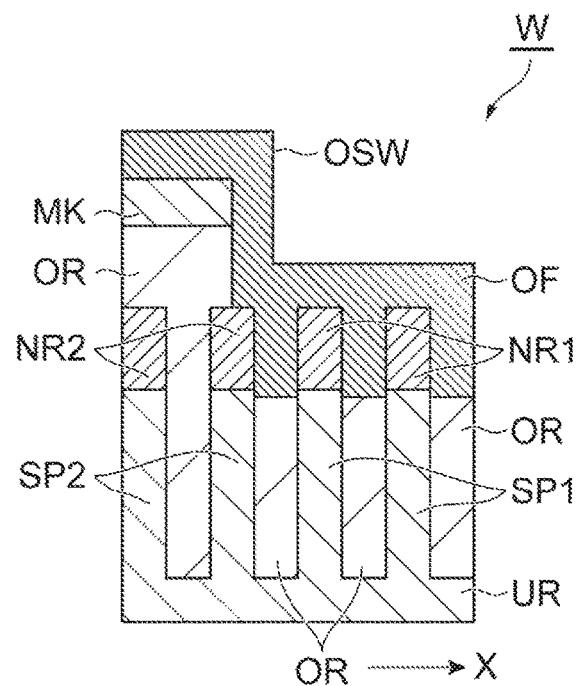
FIG. 2D is a partially enlarged sectional view illustrating an example of a workpiece in a state after Step ST2 in the method illustrated in FIG. 1 has been performed.
Figure 8:
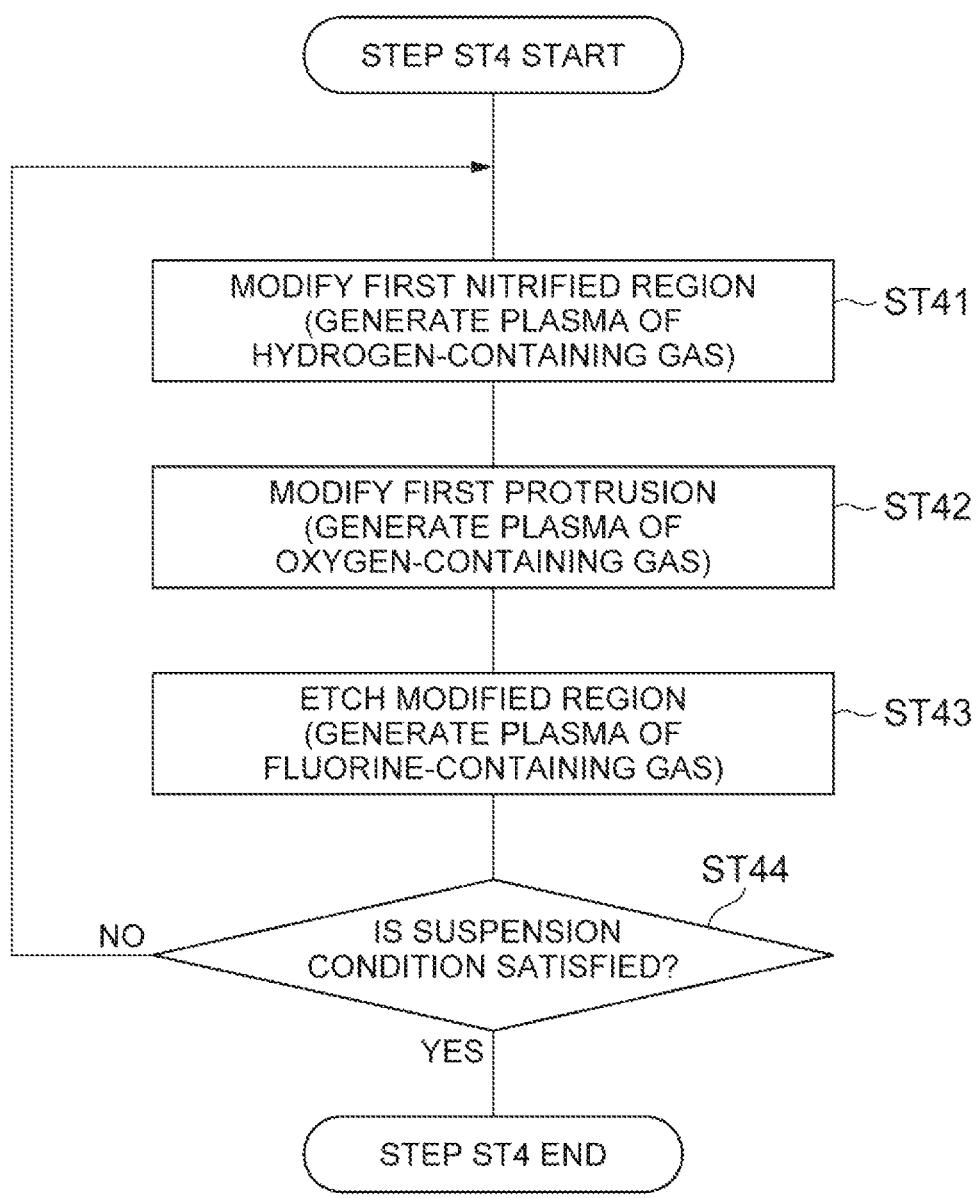
FIG. 8 is a flowchart illustrating an exemplary embodiment of Step ST4 in the method illustrated in FIG. 1.
Figure 9A:
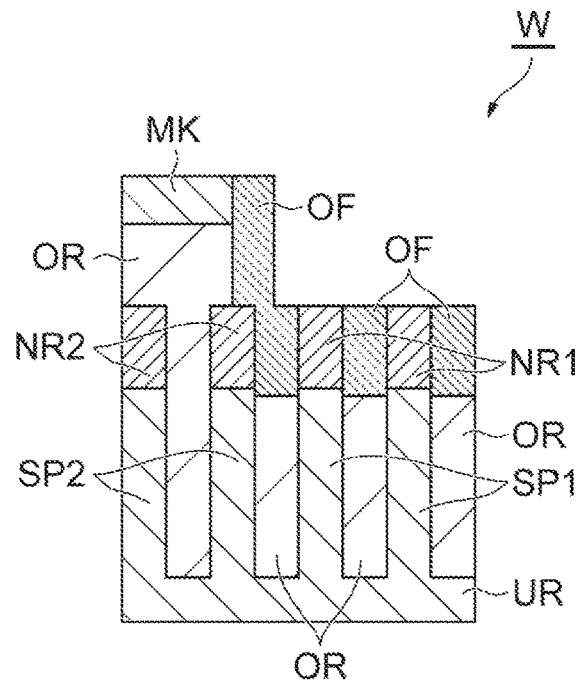
FIG. 9A is a partially enlarged sectional view illustrating an example of a workpiece in a state after Step ST3 in the method illustrated in FIG. 1 has been performed.
Figure 9B:
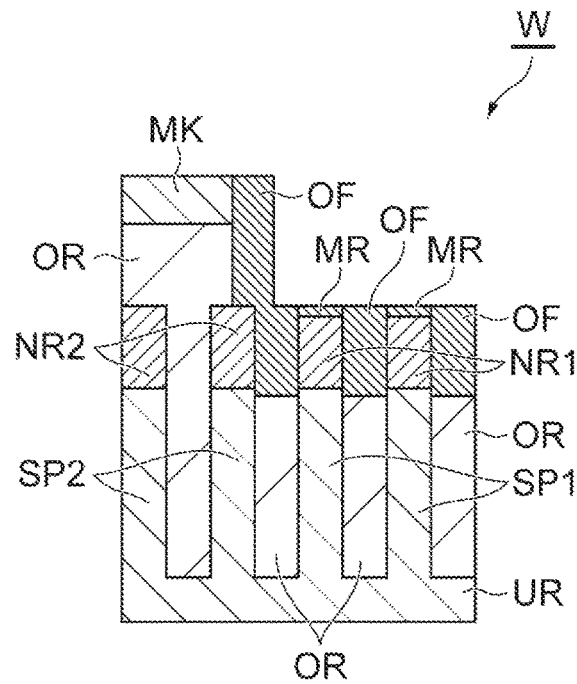
FIG. 9B is a partially enlarged sectional view illustrating an example of a workpiece in a state after Step ST41 in the method illustrated in FIG. 8 has been performed.
Figure 9C:
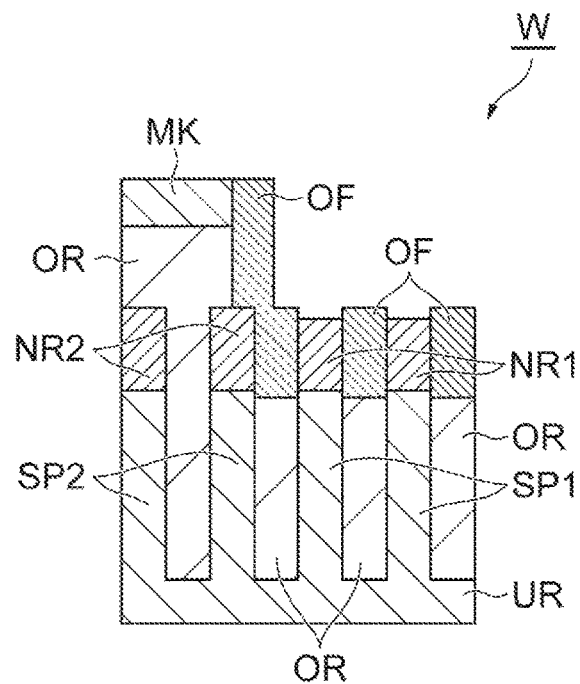
FIG. 9C is a partially enlarged sectional view illustrating an example of a workpiece in a state after Step ST43 in the method illustrated in FIG. 8 has been performed.
Figure 9D:
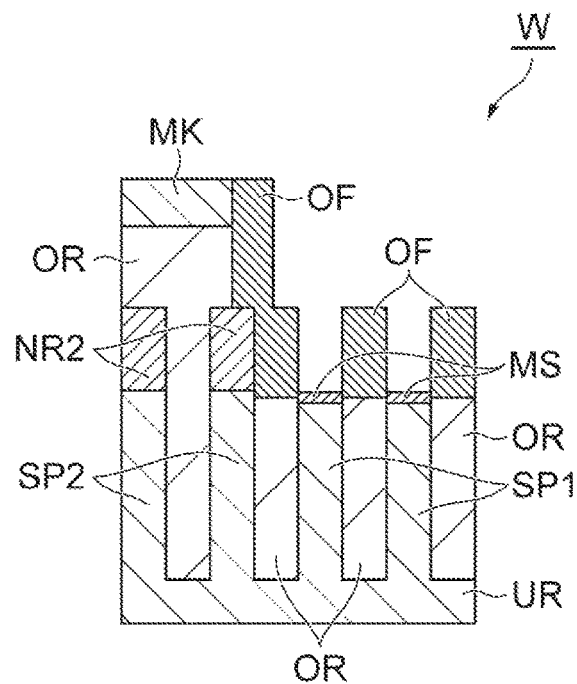
FIG. 9D is a partially enlarged sectional view illustrating an example of a workpiece in a state after Step ST42 and Step ST43 in the method illustrated in FIG. 8 have been performed.

Descriptions will be made by referring to FIG. 1 again. The method MT will be described below, taking a case using the plasma processing apparatus 10 as an example. In the following, descriptions will be made with reference to FIG. 2A, FIG. 2B, FIG. 2C, FIG. 2D, FIG. 8, FIG. 9A, FIG. 9B, FIG. 9C, and FIG. 9D in addition to FIG. 1. FIG. 2A is a partially enlarged sectional view illustrating an example of a workpiece produced in a preparation stage of the method illustrated in FIG. 1. FIG. 2B is a partially enlarged sectional view illustrating an example of a workpiece to which the method illustrated in FIG. 1 is applied. FIG. 2C is a partially enlarged sectional view illustrating an example of a workpiece in a state after Step ST1 in the method illustrated in FIG. 1 has been performed. FIG. 2D is a partially enlarged sectional view illustrating an example of a workpiece in a state after Step ST2 in the method illustrated in FIG. 1 has been performed. FIG. 8 is a flowchart illustrating an exemplary embodiment of Step ST4 in the method illustrated in FIG. 1. FIG. 9A is a partially enlarged sectional view illustrating an example of a workpiece after Step ST3 in the method illustrated in FIG. 1 has been performed. FIG. 9B is a partially enlarged sectional view illustrating an example of a workpiece after Step ST41 in the method illustrated in FIG. 8 has been performed. FIG. 9C is a partially enlarged sectional view illustrating an example of a workpiece after Step ST43 in the method illustrated in FIG. 8 has been performed. FIG. 9D is a partially enlarged sectional view illustrating an example of a workpiece after Step ST42 and Step ST43 in the method illustrated in FIG. 8 have been performed.

The method MT includes Steps ST1 to ST4. The method MT may further include Step STa. Step STa is performed before Step ST1 is performed. In Step STa, a workpiece W illustrated in FIG. 2A is prepared. The workpiece W illustrated in FIG. 2B as described above is produced from the workpiece W illustrated in FIG. 2A. In the workpiece W in FIG. 2A, an antireflection film ACF is provided on the whole surface of an organic region OR. The antireflection film ACF is an antireflection film containing silicon. A resist mask PR is provided on the antireflection film ACF. The resist mask PR has a pattern to be transferred onto the antireflection film by plasma etching. Specifically, similar to a mask MK, the resist mask PR is provided to expose a partial region of the antireflection film ACF, which extends on the partial region of the organic region OR. The resist mask PR is formed using a photolithography technology. The antireflection film ACF is etched by plasma (generated in the plasma processing apparatus 10) of a gas containing fluorocarbon. As a result, the mask MK illustrated in FIG. 2B is formed from the antireflection film ACF.

In the method MT, Step ST1 is performed on the workpiece W illustrated in FIG. 2B. In Step ST1, the organic region OR is etched so as to expose the plurality of first nitrified regions NR1. In one embodiment, Step ST1 is performed in a state where the workpiece W illustrated in FIG. 2B is placed on the electrostatic chuck 24 of the plasma processing apparatus 10. In Step ST1, plasma of a processing gas is generated in the internal space S. The processing gas may be an oxygen-containing gas. Alternatively, the processing gas may be a gas mixture of a hydrogen gas and a nitrogen gas. The oxygen-containing gas may an oxygen gas ($O_2$ gas), a CO gas, a $CO_2$ gas, or the like.

In Step ST1, the processing gas is supplied into the internal space S from the central introduction portion 50 and/or the peripheral introduction portion 52. In Step ST1, pressure in the internal space S is set to be designated pressure, by the exhaust device 30. In Step ST1, a microwave from the antenna 14 is introduced into the internal space S. As a result, plasma of the processing gas is generated in the internal space S. In Step ST1, high-frequency power from the high-frequency power generator RFG may or may not be supplied to the base 23. In Step ST1, the partial region of the organic region OR exposed from the mask MK is etched by active species from the plasma of the processing gas, as illustrated in FIG. 2C. As a result, the plurality of first nitrified regions NR1 are exposed. In Step ST1, the resist mask PR is also etched.

In one embodiment, in Step ST1, the organic region OR is etched such that the position of the upper surface of the organic region OR around a plurality of first protrusions SP1 in the height direction is identical to or lower than the position of a boundary BP between the plurality of first nitrified regions NR1 and the plurality of first protrusions SP1 in the height direction.

In Step ST2, a silicon oxide film OF is conformally formed on the surface of an intermediate product produced in Step ST1, that is, on the surface of the workpiece W illustrated in FIG. 2C (see FIG. 2D). In one embodiment, Step ST2 is performed in a state where the workpiece W illustrated in FIG. 2C is placed on the electrostatic chuck 24 of the plasma processing apparatus 10. In Step ST2, the silicon oxide film OF is formed, for example, by an atomic layer deposition method or a cyclic deposition method such as a cyclic plasma enhanced CVD method.

In Step ST2, in a case where the silicon oxide film OF is formed by the atomic layer deposition method, a sequence including a supply of a raw material gas (for example, aminosilane gas) into the internal space S, purge of the internal space S, oxidation treatment with plasma of an oxygen-containing gas (for example, oxygen gas) generated in the internal space S, and purge of the internal space S is repetitively performed. In Step ST2, the gases are also supplied to the internal space S from the central introduction portion 50 and/or the peripheral introduction portion 52. In Step ST2, pressure in the internal space S is also set to be designated pressure, by the exhaust device 30. In the oxidation treatment in Step ST2, a microwave from the antenna 14 is introduced into the internal space S in order to generate plasma of the oxygen-containing gas. In the oxidation treatment in Step ST2, high-frequency power from the high-frequency power generator RFG may or may not be supplied to the base 23.

In Step ST2, the film thickness of the silicon oxide film OF is adjusted such that the first nitrified region NR1 adjacent to the second nitrified region NR2 is at least partially exposed after etching in Step ST3 which will be described later. In Step ST2, the film thickness of the silicon oxide film OF is adjusted such that the second nitrified region NR2 adjacent to the first nitrified region NR1 is not exposed after etching in Step ST3. As illustrated in FIG. 2D, the silicon oxide film OF formed in Step ST2 has a side surface OSW. The side surface OSW extends along the side surface of the mask MK and the side surface of the organic region OR. In one embodiment of Step ST2, the film thickness of the silicon oxide film OF is adjusted such that the position of the side surface OSW in the X-direction is between the first nitrified region NR1 and the second nitrified region NR2 which are adjacent to each other.

In subsequent Step ST3, the silicon oxide film OF is etched to expose the upper surface of the plurality of first nitrified regions NR1. In one embodiment, Step ST3 is performed in a state where the workpiece W illustrated in FIG. 2D is placed on the electrostatic chuck 24 of the plasma processing apparatus 10. In Step ST3, plasma of the processing gas is generated in the internal space S, and anisotropic plasma etching is applied to the silicon oxide film OF. The processing gas used in Step ST3 may be a fluorine-containing gas. The processing gas used in Step ST3 includes a fluorocarbon gas, for example. The processing gas used in Step ST3 may further include another gas such as a rare gas.

In Step ST3, the processing gas is supplied into the internal space S from the central introduction portion 50 and/or the peripheral introduction portion 52. In Step ST3, pressure in the internal space S is set to be designated pressure, by the exhaust device 30. In Step ST3, a microwave from the antenna 14 is introduced into the internal space S. As a result, plasma of the processing gas is generated in the internal space S. In Step ST3, high-frequency power from the high-frequency power generator RFG is supplied to the base 23. Thus, ions from plasma are drawn to the silicon oxide film OF, and thus the silicon oxide film OF is etched in a vertical direction. As a result, the upper surface of the plurality of first nitrified regions NR1 are exposed, as illustrated in FIG. 9A. The plurality of second nitrified regions NR2 and the organic region OR maintain a state of being covered by the silicon oxide film OF.

Then, Step ST4 is performed. In Step ST4, the plurality of first nitrified regions NR1 are etched isotropically and selectively with respect to the silicon oxide film OF and the plurality of first protrusions SP1. In one embodiment, Step ST4 is performed in a state where the workpiece W illustrated in FIG. 9A is placed on the electrostatic chuck 24 of the plasma processing apparatus 10. In Step ST4, etching by physical energy of ions is suppressed, and etching by radical, which allows the plurality of first nitrified regions NR1 to be selectively removed, is performed.

In one embodiment, in Step ST4, a sequence including Step ST41 and Step ST43 is performed one or more times, as illustrated in FIG. 8. In one embodiment, in Step ST4, the sequence is repeated. This sequence may further include Step ST42.

In Step ST41, at least a portion of each of the plurality of first nitrified regions NR1 is modified by plasma of a hydrogen-containing gas. The hydrogen-containing gas is, for example, a hydrogen gas ($H_2$ gas). In Step ST41, another gas such as a rare gas may be supplied into the internal space S in addition to the hydrogen-containing gas. At least the portion of each of the plurality of first nitrified regions NR1 includes a surface of each of the plurality of first nitrified regions NR1. In Step ST41, at least the portion of each of the plurality of first nitrified regions NR1 is modified by active species of hydrogen, and thereby a modified region MR is formed as illustrated in FIG. 9B.

In Step ST41, the hydrogen-containing gas is supplied into the internal space S from the central introduction portion 50 and/or the peripheral introduction portion 52. In Step ST41, pressure in the internal space S is set to be designated pressure, by the exhaust device 30. In Step ST41, a microwave from the antenna 14 is introduced into the internal space S. As a result, plasma of the hydrogen-containing gas is generated in the internal space S. In Step ST41, high-frequency power from the high-frequency power generator RFG is supplied to the base 23. In Step ST41, as described above, at least the portion of each of plurality of first nitrified regions NR1 is modified by active species of hydrogen from plasma of the hydrogen-containing gas, and thereby the modified region MR is formed.

In Step ST43, the modified region MR is etched by plasma of the fluorine-containing gas. The fluorine-containing gas may be any of a $NF_3$ gas, a $SF_6$ gas, a fluorocarbon gas (for example, $CF_4$ gas), or may be a gas mixture including two or more gases among the above fluorine-containing gases. In Step ST43, another gas such as a rare gas may be supplied into the internal space S in addition to the fluorine-containing gas. In Step ST43, the modified region MR is isotropically etched by radicals of fluorine, as illustrated in FIG. 9C.

In Step ST43, the fluorine-containing gas is supplied into the internal space S from the central introduction portion 50 and/or the peripheral introduction portion 52. In Step ST43, pressure in the internal space S is set to be designated pressure, by the exhaust device 30. In Step ST43, a microwave from the antenna 14 is introduced into the internal space S. As a result, plasma of the fluorine-containing gas is generated in the internal space S. In Step ST43, high-frequency power from the high-frequency power generator RFG is not supplied to the base 23, or is set to be lower than the high-frequency power supplied to the base 23 in Step ST41. Thus, in Step ST43, physical etching by fluorine ions is suppressed, and etching by radicals is performed. As a result, the modified region MR is selectively etched.

In a case where the sequence is performed plural times, Step ST42 is included in the sequence performed at least in a period including a time point at which the plurality of first protrusions SP1 is exposed. Step ST42 may be included in each sequence which is performed plural times. In Step ST42, a portion of each of the plurality of first protrusions SP1 is oxidized by plasma of the oxygen-containing gas. The portion of each of the plurality of first protrusions SP1 includes a surface of each of the plurality of first protrusions SP1. The oxygen-containing gas may be an oxygen gas ($O_2$ gas), a CO gas, or a $CO_2$ gas. In Step ST42, another gas such as a rare gas may be supplied into the internal space S in addition to the oxygen-containing gas.

In Step ST42, the oxygen-containing gas is supplied into the internal space S from the central introduction portion 50 and/or the peripheral introduction portion 52. In Step ST42, pressure in the internal space S is set to be designated pressure, by the exhaust device 30. In Step ST42, a microwave from the antenna 14 is introduced into the internal space S. As a result, plasma of the oxygen-containing gas is generated in the internal space S. In Step ST42, high-frequency power from the high-frequency power generator RFG may or may not be supplied to the base 23. In Step ST42, the portion of each of the plurality of first protrusions SP1 is oxidized by active species of oxygen from plasma.

In one embodiment, a period in which Step ST41 is performed and a period in which Step ST42 is performed may be identical to each other or may partially overlap each other. That is, plasma of a gas mixture of the hydrogen-containing gas and the oxygen-containing gas may be simultaneously generated in the internal space S. In another embodiment, the period in which Step ST41 is performed and the period in which Step ST42 is performed may be different from each other. In this embodiment, plasma of the hydrogen-containing gas and plasma of the oxygen-containing gas are not simultaneously generated in the internal space S. Thus, the plasma processing apparatus 10 does not need to satisfy explosion-proof specifications.

In Step ST44, it is determined whether or not a suspension condition is satisfied. When the number of times of performing a sequence including Step ST41 to Step ST43 reaches a predetermined number, it is determined that the suspension condition has been satisfied. If it is determined, in Step ST44, that the suspension condition does not have been satisfied, the sequence including Step ST41 to Step ST43 is performed again. If it is determined, in Step ST44, that the suspension condition has been satisfied, the method MT ends. When the method MT ends, as illustrated in FIG. 9D, the plurality of first nitrified regions NR1 is removed. As illustrated in FIG. 9D, a portion of each of the plurality of exposed first protrusions SP1 is oxidized in Step ST42 so as to be changed to an oxidization region MS. The oxidization region MS is hardly etched by isotropic etching in Step ST43. Thus, in isotropic etching in Step ST43, etching of the plurality of first protrusions SP1 is suppressed.

In the method MT which has been described above, isotropic etching is used as etching of the plurality of exposed first nitrified regions NR1. According to isotropic etching, even though the boundary position of the mask MK is shifted from a designed position by a manufacturing error, the plurality of first nitrified regions NR1 are reliably removed so long as at least a portion of each of the plurality of first nitrified regions NR1 is exposed. Thus, the large manufacturing error of the mask MK is allowable.

In addition, the plurality of first nitrified regions NR1 are exposed by etching the organic region OR (that is, etch back of the organic region OR) in Step ST1, forming the silicon oxide film OF in Step ST2, and etching the silicon oxide film OF (that is, etch back of the silicon oxide film OF) in Step ST3. However, the organic region OR, the plurality of second protrusions SP2, and the plurality of second nitrified regions NR2 are protected by the silicon oxide film OF. Further, a chemical reaction is used in isotropic etching of the plurality of first nitrified regions NR1 in Step ST4, without substantially using physical energy. Thus, it is possible to suppress etching of the silicon oxide film OF. Thus, portions to remain, such as the organic region OR, the plurality of second protrusions SP2, and the plurality of second nitrified regions NR2, are protected by the silicon oxide film OF, and thus are retained.

In one embodiment, in Step ST1, as described above, the organic region OR is etched such that the position of the upper surface of the organic region OR around a plurality of first protrusions SP1 in the height direction is identical to or lower than the position of a boundary BP between the plurality of first nitrified regions NR1 and the plurality of first protrusions SP1 in the height direction. According to the embodiment, even though the plurality of first nitrified regions NR1 are completely removed in Step ST4, a state where the organic region OR is covered by the silicon oxide film OF is maintained.

In one embodiment, Step ST4 includes Step ST42. In Step ST42, plasma of the oxygen-containing gas is used. When Step ST42 is performed, the organic region OR of the workpiece W is covered by the silicon oxide film OF. Thus, etching of the organic region OR in Step ST42 is prevented.

In one embodiment, all the steps in the method MT are performed with the plasma processing apparatus 10. That is, all the steps in the method MT are performed in a state where the workpiece W has been accommodated in the single chamber 12 of the single plasma processing apparatus 10. According to this embodiment, the number of times of carrying the workpiece W into the internal space S and the number of times of carrying the workpiece W out from the internal space S are reduced, and thus the throughput increases.

Hereinbefore, various embodiments are described. However, various modifications may be made without being limited to the above-described embodiments. For example, a plasma processing apparatus used in performing the method MT may be any plasma processing apparatus such as an inductively coupled plasma processing apparatus or a capacitively coupled plasma processing apparatus. One or more steps among a plurality of steps in the method MT may be performed with a plasma processing apparatus different from a plasma processing apparatus used in other steps. In Step ST4, the plurality of first nitrified regions NR1 may be removed by wet etching with a solution containing phosphoric acid.

From the foregoing description, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A processing method of a workpiece, the workpiece including
    an underlying region,
    a first protrusion and a second protrusion which are formed with silicon, extend to protrude from the underlying region, and are arranged on the underlying region in one direction,
    a first nitrified region containing silicon and nitrogen and provided on a top of the first protrusion,
    a second nitrified region containing silicon and nitrogen and provided on a top of the second protrusion,
    an organic region containing carbon and provided to cover the first protrusion, the second protrusion, the first nitrified region, and the second nitrified region, and
    a mask provided on the organic region to expose a partial region of the organic region, which extends over the first protrusion and the first nitrified region,
    the method comprising:
    etching the organic region to remove the partial region of the organic region to expose the first nitrified region;
    conformally forming a silicon oxide film on a surface of an intermediate product produced from the workpiece by said etching the organic region;
    etching the silicon oxide film to expose an upper surface of the first nitrified region; and
    etching the first nitrified region isotropically and selectively with respect to the silicon oxide film and the first protrusion.

2. The processing method according to claim 1, wherein the silicon oxide film is formed by an atomic layer deposition method.

3. The processing method according to claim 1, wherein a sequence is performed once or more, the sequence including:
    modifying at least a portion of the first nitrified region, which includes a surface of the first nitrified region, by a plasma of a hydrogen-containing gas to form a modified region from at least the portion of the first nitrified region; and
    etching the modified region by a plasma of a fluorine-containing gas.

4. The processing method according to claim 3,
    wherein the sequence is performed plural times, and
    the sequence performed at least in a period including a time point at which the first protrusion is exposed includes oxidizing a portion of the first protrusion, which includes a surface of the first protrusion, by a plasma of an oxygen-containing gas.

5. The processing method according to claim 4,
    wherein a period in which said modifying at least a portion of the first nitrified region is performed is different from a period in which said oxidizing a portion of the first protrusion is performed.

6. The processing method according to claim 1,
    wherein, in said etching the organic region, the organic region is etched such that a position of an upper surface of the organic region around the first protrusion in a height direction is identical to or lower than a position of a boundary between the first nitrified region and the first protrusion in the height direction.

7. The processing method according to claim 1,
    wherein said etching the organic region, said forming a silicon oxide film, said etching the silicon oxide film, and said etching the first nitrified region are performed in a state where the workpiece is accommodated in a single chamber of a single plasma processing apparatus.

* * * * *